US012354552B2

(12) United States Patent
Kang et al.

(10) Patent No.: US 12,354,552 B2
(45) Date of Patent: Jul. 8, 2025

(54) DISPLAY DEVICE

(71) Applicant: Samsung Display Co., LTD., Yongin-si (KR)

(72) Inventors: Ki Nyeng Kang, Yongin-si (KR); Guang Hai Jin, Yongin-si (KR); Sun Kwang Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/309,611

(22) Filed: Apr. 28, 2023

(65) Prior Publication Data

US 2024/0071311 A1  Feb. 29, 2024

(30) Foreign Application Priority Data

Aug. 29, 2022 (KR) .................. 10-2022-0108311

(51) Int. Cl.
*G09G 3/3258* (2016.01)

(52) U.S. Cl.
CPC ... *G09G 3/3258* (2013.01); *G09G 2320/0233* (2013.01)

(58) Field of Classification Search
CPC ............... G09G 3/3258; G09G 2320/0233
See application file for complete search history.

(56) References Cited

U.S. PATENT DOCUMENTS

| 8,336,018 | B2 | 12/2012 | Turner et al. | |
| 9,575,556 | B2 | 2/2017 | Rekimoto | |
| 2001/0007413 | A1* | 7/2001 | Battersby | G09G 3/3233 |
| | | | | 315/169.3 |
| 2012/0050346 | A1* | 3/2012 | Sung | G09G 3/3233 |
| | | | | 345/690 |
| 2014/0132526 | A1* | 5/2014 | Lee | G06F 3/0443 |
| | | | | 345/173 |
| 2015/0372072 | A1* | 12/2015 | Xiong | H10K 59/1315 |
| | | | | 438/46 |
| 2016/0190228 | A1* | 6/2016 | Park | H10K 59/1315 |
| | | | | 257/40 |
| 2019/0155430 | A1* | 5/2019 | Hwang | G06F 3/0416 |
| 2020/0168164 | A1* | 5/2020 | Park | G09G 3/3291 |
| 2022/0173200 | A1* | 6/2022 | Ueno | H05B 33/02 |
| 2022/0197441 | A1* | 6/2022 | Choi | G06F 3/04166 |

FOREIGN PATENT DOCUMENTS

| KR | 10-2001-0102489 A | 11/2001 |
| KR | 10-2020-0062524 A | 6/2020 |

* cited by examiner

*Primary Examiner* — Hong Zhou
(74) *Attorney, Agent, or Firm* — Womble Bond Dickinson (US) LLP

(57) ABSTRACT

A display device includes: a substrate; a plurality of voltage lines extending parallel to each other on the substrate; and a voltage supplier connected to one side end of a plurality of voltage lines and configured to transmit a voltage to a plurality of voltage lines, wherein a density of the plurality of voltage lines decreases farther away from the voltage supplier.

20 Claims, 17 Drawing Sheets

DISPLAY DEVICE

CROSS-REFERENCE TO RELATED APPLICATION

This application claims priority to and the benefit of Korean Patent Application No. 10-2022-0108311 filed in the Korean Intellectual Property Office on Aug. 29, 2022, the entire contents of which are incorporated herein by reference.

BACKGROUND

1. Field

Aspects of some embodiments of the present disclosure relate to a display device.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The organic light emitting diode (OLED) display includes two electrodes and an organic emission layer interposed therebetween. Electrons injected from one electrode and holes injected from the other electrode are combined in the organic emission layer to generate excitons. The generated excitons are changed to a ground state from an excited state, releasing energy to emit light.

The organic light emitting diode display includes a plurality of pixels including an organic light emitting diode as a self-emissive element, and in each pixel, various elements such as transistors and capacitors for driving the organic light emitting diodes and various wirings that may supply signals to these elements may be positioned. In the peripheral area, various wirings, scan drivers, data drivers, controllers, etc. that transmit electrical signals to drive these pixels may be positioned.

The magnitude of the current transmitted through the wiring may be different depending on the position, and the degree of a voltage drop may be different accordingly. Therefore, there is a problem that the luminance of the display device is non-uniform as a whole.

The above information disclosed in this Background section is only for enhancement of understanding of the background and therefore the information discussed in this Background section does not necessarily constitute prior art.

SUMMARY

Aspects of some embodiments include a display device in which luminance is uniform as a whole.

A display device according to some embodiments includes a substrate; a plurality of voltage lines extending parallel to each other on the substrate; and a voltage supplier connected to one side end of a plurality of voltage lines to transmit a voltage to a plurality of voltage lines, wherein the density of the plurality of voltage lines decreases farther away from the voltage supplier.

According to some embodiments, a plurality of driving voltage lines may include a plurality of driving voltage lines transmitting a driving voltage; the voltage supplier may include a driving voltage supplier connected to a plurality of driving voltage lines, a plurality of driving voltage lines may be connected to the driving voltage supplier at one side end of the substrate, and the density of the plurality of driving voltage lines may decrease away from the first input end connected to the driving voltage supplier.

According to some embodiments, the plurality of driving voltage lines may be spaced apart from each other along a first direction and extend parallel to each other along a second direction intersecting the first direction, and a plurality of driving voltage lines may have different lengths.

According to some embodiments, the length of a plurality of driving voltage lines may repeatedly increase and decrease along the first direction.

According to some embodiments, the density of the plurality of driving voltage lines may be constant in the portion adjacent to the first input end and then gradually decrease.

According to some embodiments, among the plurality of driving voltage lines, the length of the driving voltage line positioned at both ends of the substrate may be longest.

According to some embodiments, a plurality of driving voltage lines may be spaced apart from each other along a first direction and extend parallel to each other along a second direction intersecting the first direction, and the width of the plurality of driving voltage lines gradually decreases away from the first input end.

A display device according to some embodiments may further include a plurality of light-emitting elements positioned between two adjacent driving voltage lines; and a plurality of pixel circuit units connected to a plurality of light-emitting elements, the number of the light-emitting elements positioned between two adjacent driving voltage lines at the point closest to the first input end may be the same as the number of the light-emitting elements positioned between two adjacent driving voltage lines at the point furthest from the first input end, and the number of the pixel circuit units positioned between two adjacent driving voltage lines at the point closest to the first input end may be smaller than the number of the pixel circuit units positioned between two adjacent driving voltage lines at the point furthest from the first input end.

According to some embodiments, the distance between two adjacent driving voltage lines at the point closest to the first input end may be closer than the distance between two adjacent driving voltage lines at the point furthest from the first input end.

According to some embodiments, some of a plurality of pixel circuit units are connected to one light-emitting element, and other pixel circuit units may be connected to a plurality of light-emitting elements.

According to some embodiments, the pixel circuit unit positioned between two adjacent driving voltage lines at the point furthest from the first input end may be connected to a plurality of light-emitting elements.

According to some embodiments, the first input end may be respectively positioned at both ends of the display device, and the density of the plurality of driving voltage lines may decrease from both sides of the display device toward the center.

According to some embodiments, a plurality of voltage line may further include a plurality of common voltage lines transmitting a common voltage, the voltage supplier may further include a common voltage supplier connected to a plurality of common voltage lines, a plurality of common voltage lines may be connected to the common voltage supplier at the other side end of the substrate, and the density of a plurality of common voltage lines may decrease with a distance from the second input end connected to the common voltage supplier.

According to some embodiments, the plurality of common voltage lines may be spaced apart from each other along a first direction and extend in parallel with each other along a second direction intersecting the first direction, and the plurality of common voltage lines may have different lengths.

According to some embodiments, the length of a plurality of common voltage lines may repeatedly increase and decrease along the first direction.

According to some embodiments, each driving voltage line and each common voltage line may be positioned on an imaginary line extending along the second direction, and the sum of the length of the driving voltage line and the length of the common voltage line positioned on each imaginary line may be the same.

According to some embodiments, the plurality of driving voltage lines may be spaced apart from each other along a first direction and extend parallel to each other along a second direction intersecting the first direction, the width of a plurality of driving voltage lines may gradually decrease as it moves away from the first input end, the plurality of common voltage lines may be spaced apart from each other along the first direction and extend parallel to each other along the second direction, and the width of the plurality of common voltage lines may gradually decrease as it moves away from the second input end.

According to some embodiments, the display device may include a plurality of pixels, and the sum of the area occupied by the driving voltage line and the area occupied by the common voltage line may be the same within each pixel.

A display device according to some embodiments includes a substrate; a plurality of driving voltage lines spaced apart from each other along a first direction on the substrate and extending parallel to each other along a second direction intersecting the first direction; and a driving voltage applying unit connected to one side end of a plurality of driving voltage lines, wherein the length from one side end of a plurality of driving voltage lines to the other side end repeats a pattern that gradually increases along the first direction and then gradually decreases.

According to some embodiments, the display device may further include a plurality of common voltage lines spaced apart from each other along a first direction on the substrate and extending parallel to each other along a second direction intersecting the first direction; and a common voltage applying unit connected to one side end of a plurality of common voltage lines, and the length from one side end to the other side end of a plurality of common voltage lines may repeat a pattern that gradually increases along the first direction and then gradually decreases, each driving voltage line and each common voltage line may be positioned on an imaginary line extending along the second direction, and the sum of the length of the driving voltage line and the length of the common voltage line positioned on each imaginary line may be the same.

According to some embodiments, the luminance of the display device may be uniform as a whole.

DETAILED DESCRIPTION

Figure 1:
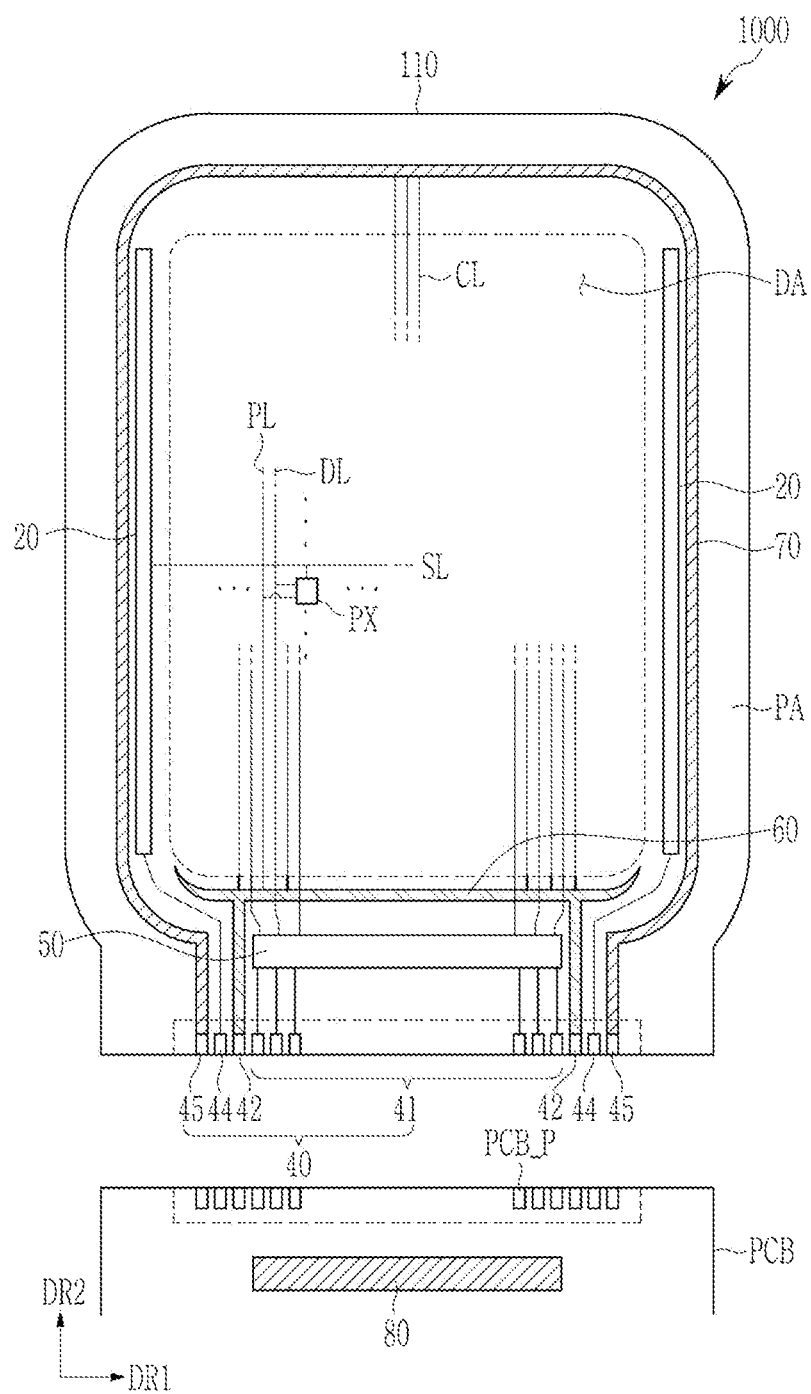
FIG. 1 is a schematic top plan view of a display device according to some embodiments.

Aspects of some embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clarify the present invention, parts that are not connected to the description will be omitted, and the same elements or equivalents are referred to by the same reference numerals throughout the specification.

Furthermore, because sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

First, the display device according to some embodiments will be described in more detail with reference to FIG. 1 as follows.

FIG. 1 is a schematic top plan view of a display device according to some embodiments.

As shown in FIG. 1, a display device 1000 according to some embodiments includes substrate 110 including a display area DA and a peripheral area PA.

The display area DA may be positioned in the center part of the display device 1000 and may have a substantially rectangular shape, and each corner part may have a rounded shape. However, the shape of the display area DA and the shape of the corner part are not limited thereto, and may be variously changed. The display area DA is the region that displays the image.

A plurality of pixels PX may be positioned in the display area DA, and each pixel PX is electrically connected to a plurality of signal lines PL, DL, and SL. A plurality of pixels PX substrate may be arranged in a matrix shape along a first direction DR1 and a second direction DR2, and a substrate may receive an image signal and accordingly display an image. In this case, the first direction DR1 and the second direction DR2 may be vertical directions. An arrangement shape of a plurality of pixel PX may be variously changed. A plurality of signal lines PL, DL, and SL may be extended to cross each other in the first direction DR1 or the second direction DR2. In addition, each pixel PX may include a plurality of transistors, capacitors, and at least one light-emitting element, which are connected to a plurality of signal lines. That is, the display device 1000 according to some embodiments may be formed of an organic light emitting device. However, the type of display device 1000 according to some embodiments is not limited thereto, and may be formed of various types of display devices.

The peripheral area PA may be positioned outside the display area DA and formed of a shape surrounding the display area DA. The peripheral area PA is an area in which an image is not displayed, and may be positioned on the outer part of the display device.

A driving circuit unit may be positioned in the peripheral area PA, and the driving circuit unit may include a plurality of driver and signal wires. As an example, the driving circuit unit may include a scan driver 20, a data driver 50, a driving voltage supply line 60, a common voltage supply line 70, and signal transmission wirings connected to them.

The scan driver 20 generates a scan signal and transmits it to each pixel PX through the scan line SL. The scan driver 20 may be located on the left and right sides of the display area, respectively. The present embodiments show a structure in which the scan driver 20 is located on both sides of the substrate 110, but is not limited thereto, and the position of the scan driver 20 may be variously changed. For example, the scan driver 20 may be located on only one side of the substrate 110.

A pad unit 40 may be located at one end of the substrate 110. For example, the pad unit 40 may be positioned at the lower end of the substrate 110. The pad unit may include a plurality of terminals 41, 42, 44, and 45. The pad unit 40 may be exposed without being covered by the insulating layer and to be electrically connected to the printed circuit board PCB. At this time, the pad unit 40 may be electrically connected to the pad unit PCB_P of the printed circuit board PCB. The printed circuit board PCB may transmit a signal of an IC driving chip 80 or power to the pad unit 40.

According to some embodiments, the controller converts a plurality of image signals transmitted from the outside into a plurality of image data signals, and transmits the converted signals to the data driver 50 through the terminal 41. In addition, the controller may receive a vertical synchronization signal, a horizontal synchronizing signal, and a clock signal to generate a control signal for controlling the driving of the scan driver 20 and the data driver 50 and transmit them to each through the terminals 44 and 41. The controller transmits a driving voltage ELVDD to the driving voltage supply line 60 through the terminal 42. In addition, the controller delivers a common voltage ELVSS to the common voltage supply line 70 through the terminal 45.

The data driver 50 may be located on the peripheral area PA. The data driver 50 generates a data signal and transmits it to each pixel PX through the data line DL. The data driver 50 may be located on one side of the display panel DP. For example, the data driver 50 may be located between the pad unit 40 and the display area DA. The data driver 50 and the controller may each consist of a separate IC, or may be combined with each other to form a single IC. When the data driver 50 and the controller consist of a single IC, the integration and data transmission speed may be improved, and power consumption may be reduced.

The driving voltage supplier 60 may be located on the peripheral area PA. The driving voltage supplier 60 may be located at the lower end of the substrate 110. For example, the driving voltage supplier 60 may be located between the data driver and the display area DA. The driving voltage supplier 60 may be extended mainly along the first direction DR1. The driving voltage supplier 60 may further include a part protruded from the part extending along the first direction DR1 and extending long along the second direction DR2. The end of the portion extending along the second direction DR2 may be connected to the printed circuit board PCB to receive the driving voltage ELVDD.

The driving voltage supplier 60 may be connected to the driving voltage line PL. The driving voltage line PL may receive the driving voltage ELVDD from the driving voltage supplier 60 and transmit the driving voltage ELVDD to each pixel PX. The driving voltage line PL may be mainly positioned in the display area DA, and may extend to the peripheral area PA so as to be connected to the driving voltage supplier in the portion adjacent to the driving voltage supplier 60. The driving voltage supplier 60 and the driving voltage line PL may be connected at the lower end of the substrate 110. The driving voltage line PL may be formed to extend from the portion connected to the driving voltage supplier 60 toward the opposite side. The driving voltage line PL may extend from one side end of the display area DA toward the other side end. For example, the driving voltage line PL may extend from the lower end of the display area DA toward the upper end. The display device according to some embodiments may include a plurality of driving voltage lines PL. A plurality of driving voltage lines PL may be spaced apart from each other in the first direction DR1 and extend in parallel with each other in the second direction DR2.

The common voltage supplier 70 may be located on the peripheral area PA. The common voltage supplier 70 may have a shape surrounding the display area DA. For example, the common voltage supplier 70 may extend from the lower end of the substrate 110 and reach the lower end through the left end, upper end, and the right end of the substrate 110. The end of the common voltage supplier 70 may be connected to the printed circuit board PCB so that the common voltage ELVSS may be applied.

The common voltage supplier 70 may be connected to the common voltage line CL. The common voltage line CL may receive the common voltage ELVSS from the common voltage supplier 70 and transmit the common voltage ELVSS to each pixel PX. The common voltage line CL may be connected to one electrode (e.g., a second electrode) of the light-emitting element to transmit the common voltage ELVSS. The common voltage line CL may be mainly positioned in the display area DA, and may be extended to the peripheral area PA so as to be connected to the common voltage supplier 70 in the part adjacent to the common voltage supplier 70. The common voltage supplier 70 and the common voltage line CL may be connected at the upper end of the substrate 110. The common voltage line CL may be formed to extend from the part connected to the common voltage supplier 70 toward the opposite side. The common voltage line CL may extend from one side end of the display area DA toward the other side end. For example, the common voltage line CL may extend from the upper end of the display area DA toward the lower end. The display device according to some embodiments may include a plurality of common voltage lines CL. A plurality of common voltage lines CL may be spaced apart from each other in the first direction DR1 and extend in parallel with each other in the second direction DR2.

Hereinafter the cross-section structure of one pixel of the display device according to some embodiments is described with reference to FIG. 2.

Figure 2:
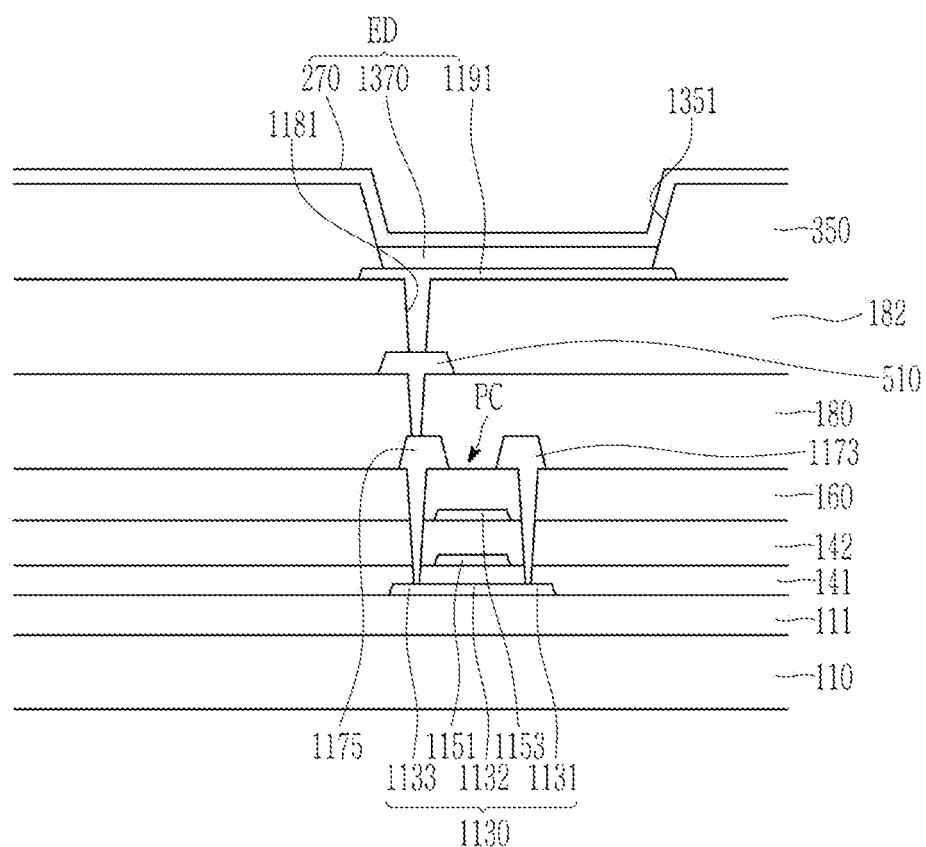
FIG. 2 is a cross-sectional view showing a part of a display device according to some embodiments.

FIG. 2 is a cross-sectional view showing a part of a display device according to some embodiments.

As shown in FIG. 2, a display device according to some embodiments includes a pixel circuit unit PC positioned on a substrate 110, and a light-emitting element ED connected to the pixel circuit unit PC.

The substrate 110 may include at least one among polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material capable of bending or folding and may be single-layered or multi-layered.

A buffer layer 111 may be positioned on the substrate 110. The buffer layer may have a single-layered or multi-layered structure. The buffer layer 111 may include an inorganic insulating material or an organic insulating material such as a silicon nitride (SiNx), a silicon oxide (SiOx), and a silicon oxynitride (SiOxNy). The buffer layer 111 may be omitted if necessary. In addition, a barrier layer may be further positioned between the substrate 110 and the buffer layer 111. The barrier layer may have a single-layered or multi-layered structure. The barrier layer may include an inorganic insulating material such as a silicon nitride (SiNx), a silicon oxide (SiOx), and a silicon oxynitride (SiOxNy).

A semiconductor layer including a semiconductor 1130 of the pixel circuit unit PC may be positioned on the buffer layer 111. The semiconductor 1130 may include a first region 1131, a channel 1132, and a second region 1133. The first region and the second region 1133 may be positioned on both sides of channel 1132 of the semiconductor 1130 of the pixel circuit unit PC, respectively. The semiconductor of the pixel circuit unit PC may include a semiconductor material such as amorphous silicon, polysilicon, or an oxide semiconductor.

A first gate insulating layer 141 may be positioned on the semiconductor 1130 of the pixel circuit unit PC. The first gate insulating layer 141 may have a single-layered or multi-layered structure. The first gate insulating layer 141 may include an inorganic insulating material such as a silicon nitride (SiNx), a silicon oxide (SiOx), or a silicon oxide (SiOxNy).

A first gate conductive layer including a gate electrode 1151 of the pixel circuit unit PC may be positioned on the first gate insulating layer 141. The gate electrode 1151 of the pixel circuit unit PC may overlap the channel 1132 of the semiconductor 1130. The first gate conductive layer may have a single-layered or multi-layered structure. The first gate conductive layer may include a metal material such as molybdenum (Mo), aluminum (Al), copper (Cu), and/or titanium (Ti). After forming the first gate conductive layer, a doping process or plasma treatment can be performed. The part of the semiconductor layer covered by the first gate conductive layer is not doped or plasma treated, and the part of the semiconductor layer not covered by the first gate conductive layer is doped or plasma treated, so it may have the same characteristics as the conductor.

A second gate insulating layer 142 may be positioned on the first gate conductive layer including the gate electrode 1151 of the pixel circuit unit PC. The second gate insulating layer 142 may have a single-layered or multi-layered structure. The second gate insulating layer 142 may include an inorganic insulating material such as a silicon nitride (SiNx), a silicon oxide (SiOx), or a silicon oxynitride (SiOxNy).

A second gate conductive layer including a first storage electrode 1153 may be positioned on the second gate insulating layer 142. The second gate conductive layer may have a single-layered or multi-layered structure. The second gate conductive layer may include a metal material such as molybdenum (Mo), aluminum (Al), copper (Cu), and/or titanium (Ti). The first storage electrode 1153 overlaps the gate electrode 1151 to form a storage capacitor.

A first interlayer insulating layer 160 may be positioned on the second gate conductive layer including the first storage electrode 1153. The first interlayer insulating layer 160 may have a single-layered or multi-layered structure. The first interlayer insulating layer 160 may include an inorganic insulating material or an organic insulating material.

A first data conductive layer including a source electrode 1173 and a drain electrode 1175 of the pixel circuit unit PC may be positioned on the first interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first interlayer insulating layer 160 may include an opening overlapping the source electrode 1173 of the pixel circuit unit PC and the first region 1131 of the semiconductor 1130. The opening may also be formed in the first gate insulating layer and the second gate insulating layer 142. The source electrode 1173 of the pixel circuit unit PC may be connected to the first region 1131 of the semiconductor 1130 through the opening. The first interlayer insulating layer 160 may include an opening overlapping the drain electrode 1175 of the pixel circuit unit PC and the second region of the semiconductor 1130. The opening may also be formed in the first gate insulating layer 141 and the second gate insulating layer 142. The drain electrode of the pixel circuit unit PC may be connected to the second region 1133 of the semiconductor 1130 through the opening.

A first passivation layer 180 may be positioned on the first data conductive layer including the source electrode 1173 and the drain electrode 1175 of the pixel circuit unit PC. The first passivation layer 180 may include an inorganic insulating material such as a silicon nitride (SiNx), a silicon oxide (SiOx), and a silicon oxynitride (SiOxNy) and/or an organic insulating material such as a polyimide, an acryl-based polymer, and a siloxane-based polymer.

A second data conductive layer including a connection electrode 510 of the pixel circuit unit PC may be positioned on the first passivation layer 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first passivation layer 180 may include an opening overlapping the drain electrode 1175 of the pixel circuit unit PC. The connection electrode 510 of the pixel circuit unit PC may be connected to the drain electrode 1175 through the opening.

A second passivation layer 182 may be positioned on the second data conductive layer including the connection electrode 510 of the pixel circuit unit PC. The second passivation layer 182 may include an insulating material such as a general-purpose polymer such as poly(methyl methacrylate) (PMMA) or polystyrene (PS), a polymer derivative having a phenolic group, an acryl-based polymer, an imide-based polymer, a polyimide, an acryl-based polymer, or an organic polymer such as a siloxane-based polymer.

The light-emitting element ED connected to the pixel circuit unit PC may be positioned on the second passivation layer 182. The light-emitting element ED may include a pixel electrode 1191, an emission layer 1370, and a common electrode 270.

The pixel electrode 1191 of the light-emitting element ED may be positioned over the second passivation layer 182. The second passivation layer 182 may include an opening 1181 overlapping the pixel electrode 1191 of the light-emitting element ED and the connection electrode 510 of the pixel circuit unit PC. The pixel electrode 1191 of the light-emitting element ED may be connected to the connection electrode 510 of the pixel circuit unit PC through the opening 1181. Accordingly, the pixel electrode of the light-emitting element ED may be connected to the drain electrode 1175 of the pixel circuit unit PC through the connection electrode 510.

A partition wall 350 may be positioned on the pixel electrode 1191 of the light-emitting element ED. A pixel opening 1351 is formed in the partition wall 350, and the pixel opening 1351 of the partition wall 350 may overlap the pixel electrode 1191.

In the pixel opening 1351 of the partition wall 350, an emission layer 1370 of the light-emitting element ED may be positioned. The emission layer 1370 may overlap the pixel electrode 1191.

A common electrode 270 may be positioned on the emission layer 1370 and the partition wall 350.

The light-emitting element ED emits light around the region where the pixel electrode 1191, the emission layer 1370, and the common electrode 270 overlap, and the light-emitting region of the light-emitting element ED may overlap the pixel circuit unit PC connected thereto.

Although one transistor included in one pixel circuit unit has been described above, each pixel may include a plurality of transistors. Hereinafter, an example of a connection structure of a plurality of transistors included in one pixel of the display device according to some embodiments is described with reference to FIG. 3.

Figure 3:
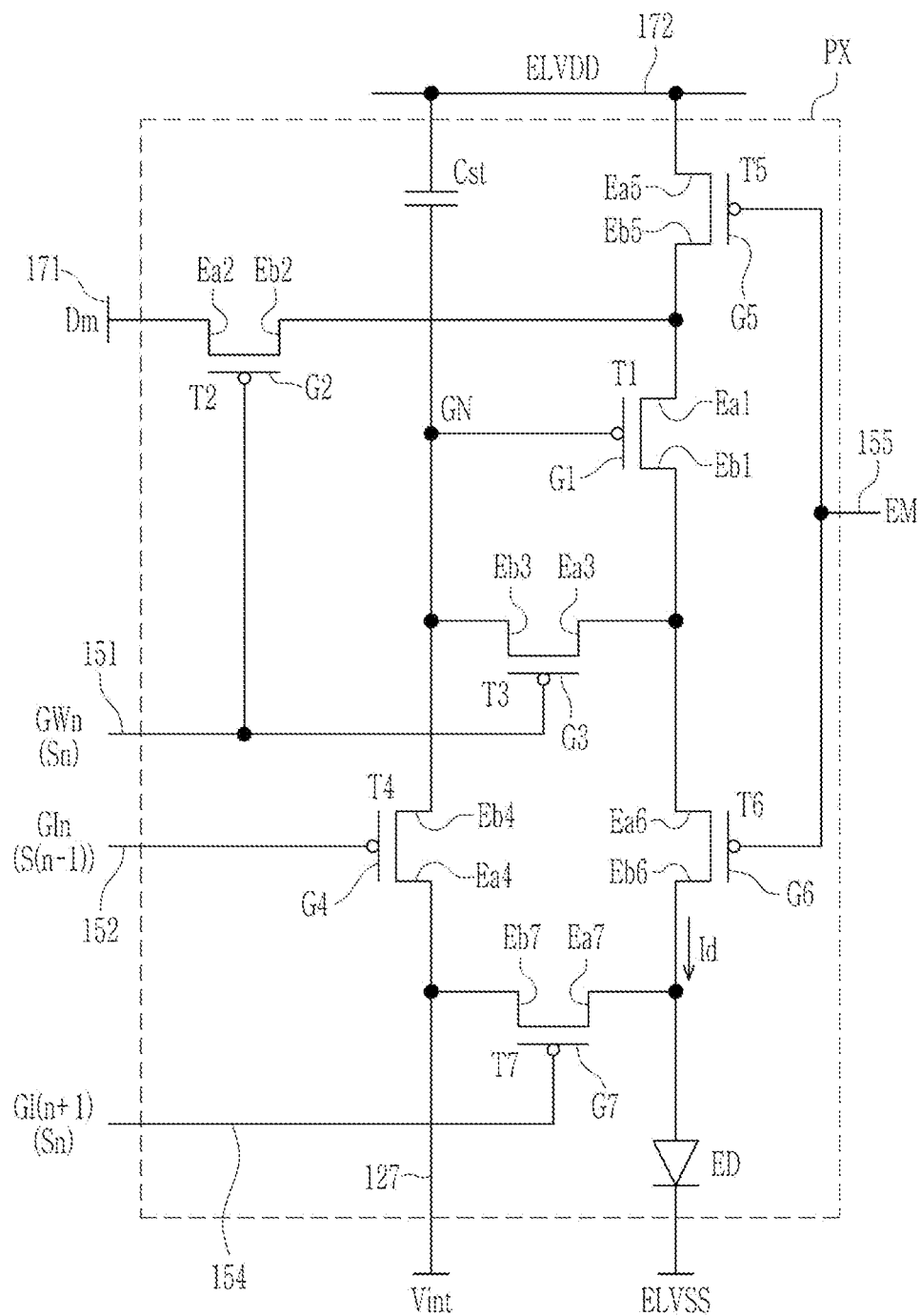
FIG. 3 is a circuit diagram of one pixel of a display device according to some embodiments.

FIG. 3 is a circuit diagram of one pixel of a display device according to some embodiments.

As shown in FIG. 3, a display device according to some embodiments includes a plurality of pixels PX and a plurality of signal lines 127, 151, 152, 153, 154, 171, and 172 capable of displaying an image. One pixel PX may include a plurality of transistors T1, T2, T3, T4, T5, T6, and T7, a capacitor Cst, and at least one light emission diode (LED), which are connected to a plurality of signal lines 127, 151, 152, 153, 154, 171, and 172. In the present embodiments, an example in which one pixel PX includes one light emission diode (LED) is mainly described.

The signal lines 127, 151, 152, 154, 155, 171, and 172 may include an initialization voltage line 127, a plurality of scan lines 151, 152, and 154, a light emission control line 155, a data line 171, and a driving voltage line 172. The scan lines 151, 152, and 154 may correspond to the aforementioned scan line (SL in FIG. 1), the data line 171 may correspond to the aforementioned data line (DL in FIG. 1), and the driving voltage line 172 may correspond to the aforementioned driving voltage line (PL of FIG. 1).

The initialization voltage line 127 may transmit an initialization voltage Vint. A plurality of scan lines 151, 152, and 154 may transmit scan signals GWn, Gin, and GI(n+1), respectively. The scan signals GWn, Gin, and GI(n+1) may transmit a gate-on voltage and a gate-off voltage capable of turning-on/turning-off the transistors T2, T3, T4, and T7 included in the pixel PX.

The scan lines 151, 152, and 154 connected to one pixel PX may include a first scan line 151 capable of transmitting the scan signal GWn, a second scan line 152 capable of transmitting the scan signal GI, having the gate-on voltage at different timing from that of the first scan line 151, and a third scan line 154 capable of transmitting the scan signal GI(n+1). In the present embodiments, an example in which the second scan line 152 transmits the gate-on voltage at timing prior to that of the first scan line 151 is mainly described. For example, if the scan signal GWn is an n-th scan signal (Sn) (n is a natural number of 1 or more) among the scan signals applied during one frame, the scan signal GIn may be a scan signal of a previous stage such as the (n−1)-th scan signal S(n−1), and the scan signal GI(n+1) may be the n-th scan signal (Sn). However, the embodiments according to the present disclosure are not limited thereto, and the scan signal GI(n+1) may be a different scan signal from the n-th scan signal (Sn).

The light emission control line 155 may transmit a control signal, and particularly may transmit a light emission control signal EM capable of controlling emission of the light emitting diode (LED) included in the pixel PX. The control signal transmitted by the light emission control line 155 may be the gate-on voltage and the gate-off voltage, and may have a different waveform from the scan signal transmitted by the scan lines 151, 152, and 154.

The data line 171 may transmit a data signal Dm, and the driving voltage line 172 may transmit a driving voltage ELVDD. The data signal Dm may have a different voltage level according to the image signal input to the display device, and the driving voltage ELVDD may have a substantially constant level.

According to some embodiments, the display device may further include a driving unit that transmits signals to a plurality of signal lines 127, 151, 152, 153, 154, 171, and 172.

A plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the light emission control line 155 may transmit the light emission control signal EM to the fifth transistor T5 and the sixth transistor T6.

The gate electrode G1 of the driving transistor T1 is connected to one terminal of the capacitor Cst through a driving gate node GN, the first electrode Ea1 of the driving transistor T1 is connected to the driving voltage line 172 via the fifth transistor T5, and the second electrode Eb1 of the driving transistor T1 is connected to an anode of the light emitting diode (LED) via the sixth transistor T6. The driving transistor T1 may receive the data signal Dm transmitted by the data line 171 depending on the switching operation of the second transistor T2 to supply the driving current Id to the light emitting diode (LED).

The gate electrode G2 of the second transistor T2 is connected to the first scan line 151, the first electrode Ea2 of the second transistor T2 is connected to the data line 171, and the second electrode Eb2 of the second transistor T2 is connected to the first electrode Ea1 of the driving transistor T1 and is connected to the driving voltage line 172 via the fifth transistor T5. The second transistor T2 is turned on depending on the scan signal GWn transmitted through the first scan line 151, thereby transmitting the data signal Dm transmitted from the data line 171 to the first electrode Ea1 of the driving transistor T1.

The gate electrode G3 of the third transistor T3 is connected to the first scan line 151, and the first electrode Ea3 of the third transistor T3 is connected to the second electrode Eb1 of the driving transistor T1 and is connected to the anode of the light emitting diode (LED) via the sixth transistor T6. The second electrode Eb3 of the third transistor T3 is connected to the second electrode Eb4 of the fourth transistor T4, one terminal of the capacitor Cst, and the gate electrode G1 of the driving transistor T1. The third transistor T3 is turned on depending on the scan signal GWn transmitted through the first scan line 151 to connect the gate electrode G1 and the second electrode Eb1 of the driving transistor T1, thereby diode-connecting the driving transistor T1.

The gate electrode G4 of the fourth transistor T4 is connected to the second scan line 152, the first electrode Ea4 of the fourth transistor T4 is connected to the initialization voltage Vint terminal, and the second electrode Eb4 of the fourth transistor T4 is connected to one terminal of the capacitor Cst and the gate electrode G1 of the driving transistor T1 through the second electrode Eb3 of the third transistor T3. The fourth transistor T4 is turned on depending on the scan signal GIn transmitted through the second scan line 152 to transmit the initialization voltage Vint to the gate electrode G1 of the driving transistor T1, thereby performing an initialization step of initializing the voltage of the gate electrode G1 of the driving transistor T1.

The gate electrode G5 of the fifth transistor T5 is connected to the light emission control line 155, the first electrode Ea5 of the fifth transistor T5 is connected to the driving voltage line 172, and the second electrode Eb5 of the fifth transistor T5 is connected to the first electrode Ea1 of the driving transistor T1 and the second electrode Eb2 of the second transistor T2.

The gate electrode G6 of the sixth transistor T6 is connected to the light emission control line 155, the first electrode Ea6 of the sixth transistor T6 is connected to the second electrode Eb1 of the driving transistor T1 and the first electrode Ea3 of the third transistor T3, and the second electrode Eb6 of the sixth transistor T6 is electrically connected to the anode of the light emitting diode (LED). The fifth transistor T5 and the sixth transistor T6 are simultaneously turned on depending on the light emission control signal EM transmitted through the light emission control line 155, thereby transmitting the driving voltage ELVDD to the light emitting diode (LED) through the diode-connected driving transistor T1.

The gate electrode G7 of the seventh transistor T7 is connected to the third scan line 154, the first electrode Ea7 of the seventh transistor T7 is connected to the second electrode Eb6 of the sixth transistor T6 and the anode of the light emitting diode (LED), and the second electrode Eb7 of the seventh transistor T7 is connected to the initialization voltage Vint terminal and the first electrode Ea4 of the fourth transistor T4.

The transistors T1, T2, T3, T4, T5, T6, and T7 may each be a P-type channel transistor such as a PMOS, however they are not limited thereto, and at least one among the transistors T1, T2, T3, T4, T5, T6, and T7 may be an N-type channel transistor.

As above-described, one terminal of the capacitor Cst is connected to the gate electrode G1 of the driving transistor T1 and the other terminal thereof is connected to the driving voltage line 172. A cathode of the light emitting diode (LED) is connected to the common voltage ELVSS terminal transmitting a common voltage ELVSS, thereby receiving the common voltage ELVSS.

The circuit diagram of the pixel shown in FIG. 3 is only an example, and the number of the transistors, the number of the capacitors included in one pixel PX of the display device according to some embodiments, and the connection relationship therebetween may be changed in various ways Hereinafter, the driving voltage line of the display device according to some embodiments is described with reference to FIG. 4 to FIG. 6.

Figure 4:
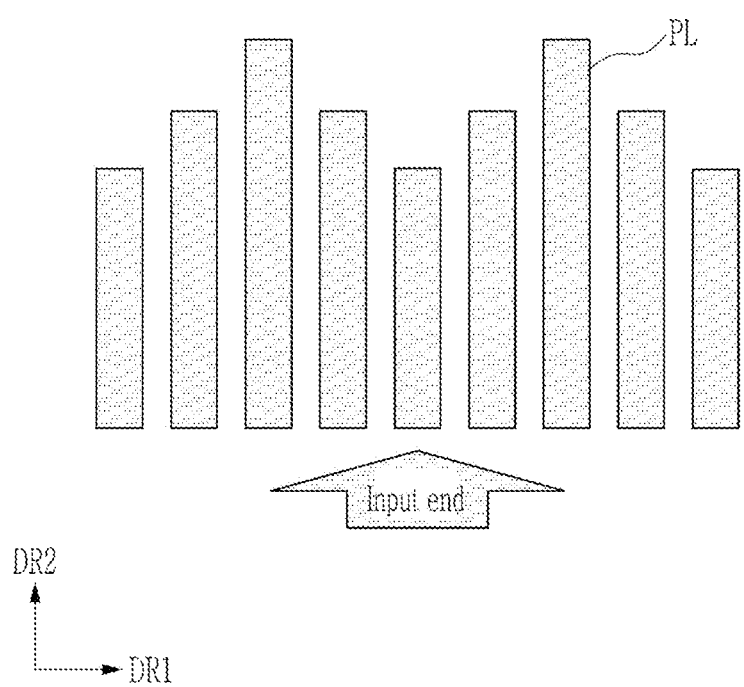
FIG. 4 to FIG. 6 are top plan views schematically showing some constituent elements of a display device according to some embodiments.
Figure 5:
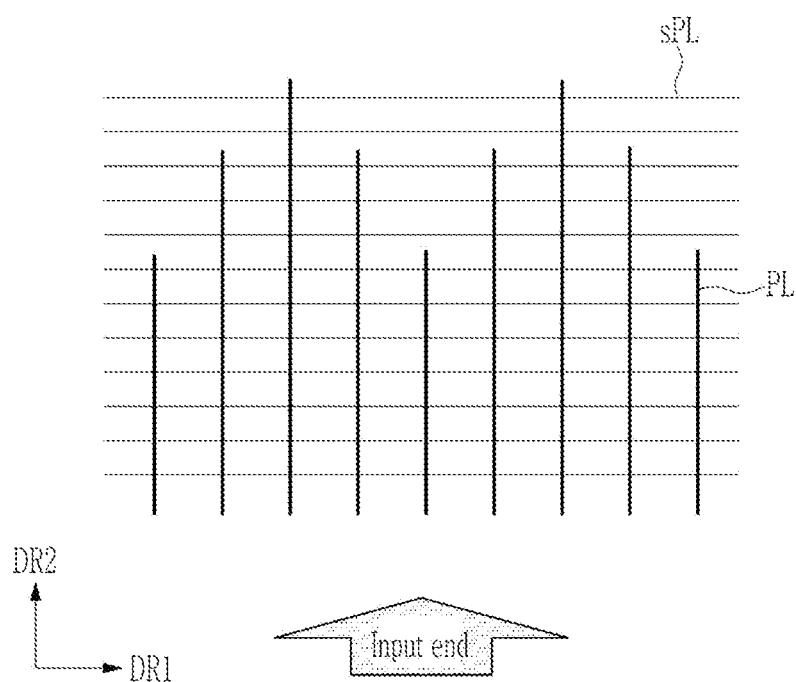
Figure 6:
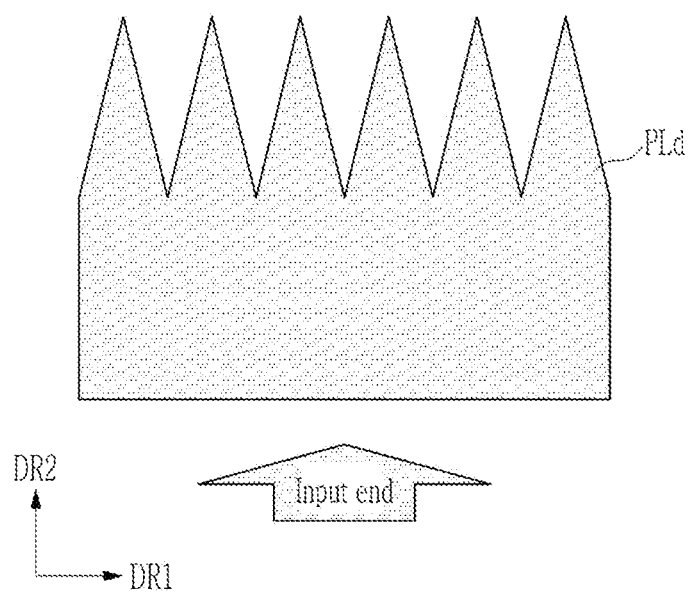

FIG. 4 to FIG. 6 are top plan views schematically showing some elements of a display device according to some embodiments. FIG. 4 shows a planar shape and an arrangement shape of a plurality of driving voltage lines, FIG. 5 shows an arrangement form of a plurality of driving voltage lines and other wiring, and FIG. 6 shows a density of the driving voltage lines.

As shown in FIG. 4, a plurality of driving voltage lines PL are spaced apart from each other along the first direction DR1. A plurality of driving voltage lines PL may be spaced apart from each other with a uniform interval. However, the present invention is not limited thereto, and the interval between a plurality of driving voltage lines PL may not be uniform. A plurality of driving voltage lines PL extend in parallel along a second direction DR2 intersecting the first direction DR1. In this case, the first direction DR1 and the second direction DR2 may be vertical directions.

The width of the driving voltage line PL may be constant. From a point close to the input end to a point farther away, the width of the driving voltage line PL may be constant. Also, a plurality of driving voltage lines PL may have the same width. However, the present invention is not limited thereto, and at least some of a plurality of driving voltage lines PL may have different widths. A plurality of driving voltage lines PL may have different lengths. One side ends of a plurality of driving voltage lines PL may be positioned on an imaginary line extending along the first direction DR1. That is, one side ends of a plurality of driving voltage lines PL may be aligned in a line. One side ends of a plurality of driving voltage lines PL are input ends to which a driving voltage is applied from a driving voltage supplier. The same voltage may be applied to a plurality of driving voltage lines PL. The other side ends of a plurality of driving voltage lines PL may not be aligned. The other side ends of a plurality of driving voltage lines PL are ends positioned opposite to the input end. A pattern in which a length from one side end of a plurality of driving voltage lines PL to the other side end gradually increases along the first direction DR1 and then gradually decreases may be repeated. For example, the length of the second driving voltage line PL may be longer than the length of the first driving voltage line PL positioned at the left end. The length of the third driving voltage line PL may be longer than the length of the second driving voltage line PL. The length of the fourth driving voltage line PL may be shorter than the length of the third driving voltage line PL, and the length of the fifth driving voltage line PL may be shorter than the length of the fourth driving voltage line PL. As such, the tendency for the length of the driving voltage line PL to gradually increase and then to gradually decrease may be the same from the fifth driving voltage line PL to the ninth driving voltage line PL. In FIG. 4, a structure in which the pattern in which the length changes with a cycle of the five driving voltage line PL is repeated has been described, but this is only an example and may be variously changed. The total number of the driving voltage lines PL may be greater, and the cycle in which the length change of the driving voltage line PL is repeated may be larger.

As shown in FIG. 5, the display device according to some embodiments may further include an auxiliary driving voltage line sPL that crosses and overlaps the driving voltage line PL. The auxiliary driving voltage line sPL may be extended along the first direction. The display device according to some embodiments may include a plurality of auxiliary driving voltage lines sPL, and a plurality of auxiliary driving voltage lines sPL may be spaced apart from each other along the second direction DR2 and extend in parallel with each other.

The auxiliary driving voltage line sPL may be positioned on a different layer from the driving voltage line PL. For example, the driving voltage line PL may be positioned on the second data conductive layer, and the auxiliary driving voltage line sPL may be positioned on the first gate conductive layer. However, the present invention is not limited thereto, and the driving voltage line PL may be positioned on another layer instead of the second data conductive layer. For example, the driving voltage line PL may be positioned on the first data conductive layer. Also, the auxiliary driving voltage line sPL may be positioned on another layer instead of the first gate conductive layer. For example, an auxiliary driving voltage line sPL may be placed on the second gate conductive layer.

An insulating layer may be positioned between the auxiliary driving voltage line sPL and the driving voltage line PL extending in the different directions. An opening may be formed in this insulating layer, and the auxiliary driving voltage line sPL and the driving voltage line PL may be connected to each other through the opening. As the driving voltage line PL has the different length depending on the position, the driving voltage line PL may not be positioned in at least a part of the display area. Because the auxiliary driving voltage line sPL connected to the driving voltage line PL is positioned even in a portion where the driving voltage line PL is not positioned, the driving voltage may be transmitted well to the entire display area.

In the display device according to some embodiments, the length of a plurality of driving voltage lines PL is different depending on the position, and if this is expressed as a density PLd of the driving voltage line, as shown in FIG. 6, as the distance from the input end to which the driving voltage is applied increases, the density PLd of the driving voltage line may be lowered. If the display device is divided into a lower half and an upper half, the density PLd of the driving voltage line may be constant in the lower half of the display device. In the upper half of the display device, the density PLd of the driving voltage line may gradually decrease as the distance from the input end increases. Accordingly, the density PLd of the driving voltage line may be expressed in a form of a quadrangle in the lower half of the display device, and in a form that a plurality of triangles may be repeatedly arranged along the first direction DR1 in the upper half of the display device. In this case, the triangle may be an isosceles triangle, and a bottom side of a plurality of isosceles triangles may be in contact with one side of the quadrangle. However, this is only an example, and the triangle may not be an isosceles triangle.

Hereinafter, the flow of the current from the input end to which the driving voltage is applied is described with reference to FIG. 7.

Figure 7:
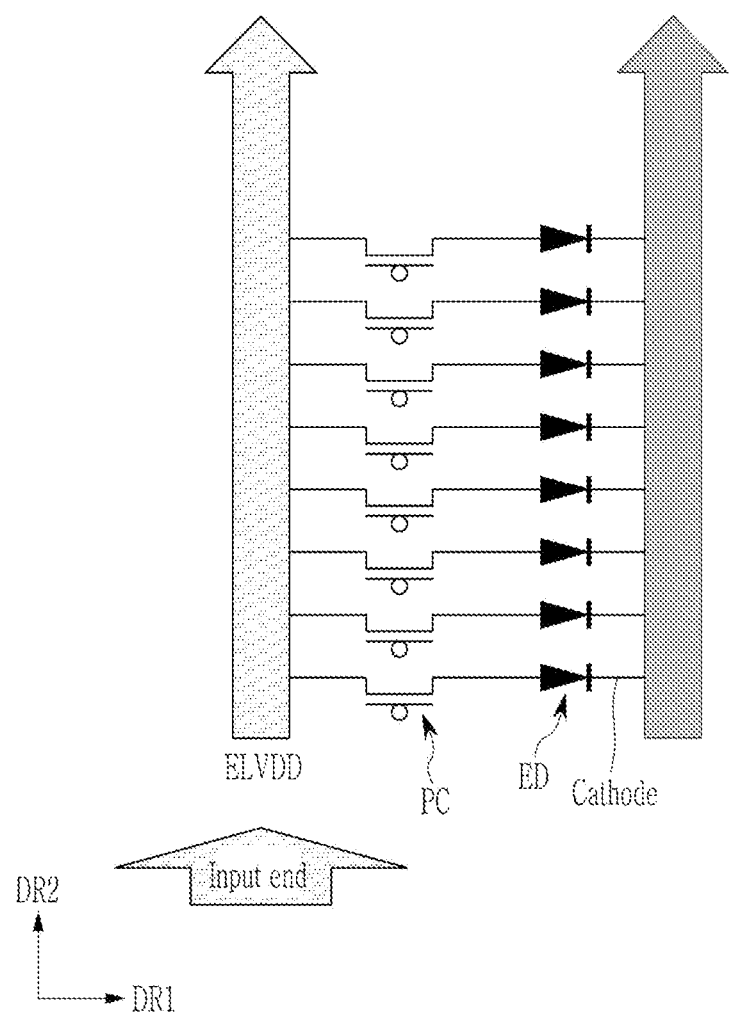
FIG. 7 is a view schematically showing a flow of a current in a display device according to some embodiments.

FIG. 7 is a view schematically showing a flow of a current in a display device.

As shown in FIG. 7, if the driving voltage ELVDD is applied from the input end, the current may flow in the opposite direction (a direction indicated by an arrow) from the point adjacent to the input end. One pixel array connected to the same driving voltage line may be considered. When the current arrives at the first pixel positioned closest to the input end among a plurality of pixels included in one pixel array, some current is distributed to the pixel circuit unit PC of the first pixel and flows to the light-emitting element ED and the cathode Cathode. After being distributed to the first pixel, the remaining current continues to travel along the driving voltage line. When the remaining current arrives at the second pixel, some current is distributed to the pixel circuit unit PC of the second pixel and flows to the light-emitting element ED and the cathode Cathode. After being distributed to the second pixel, the remaining current continues to travel along the driving voltage line. As such, the remaining current is dispersed in the third and fourth pixels, and when the current reaches the last pixel, the current flowing along the driving voltage line becomes the smallest. That is, the magnitude of the current is the largest at the input end to which the driving voltage ELVDD is applied, and the magnitude of the current gradually decreases as it moves away from the input end. Therefore, the voltage drop IR drop at the input end may be the largest, and due to this, the luminance may appear as a non-uniform phenomenon depending on the position of the display device.

In the display device according to some embodiments, this luminance non-uniformity may be solved by differently adjusting the density of the driving voltage lines according to the position. The resistance may be minimized by increasing the density of the driving voltage lines at the input end, and the resistance may be gradually increased by lowering the density of the driving voltage lines as the distance from the input end is increased. Due to this, the degree of the voltage drop according to the position may be made similar, and the display device may express the uniform luminance as a whole.

Next, the display device according to some embodiments is described with reference to FIG. 8 as follows.

Figure 8:
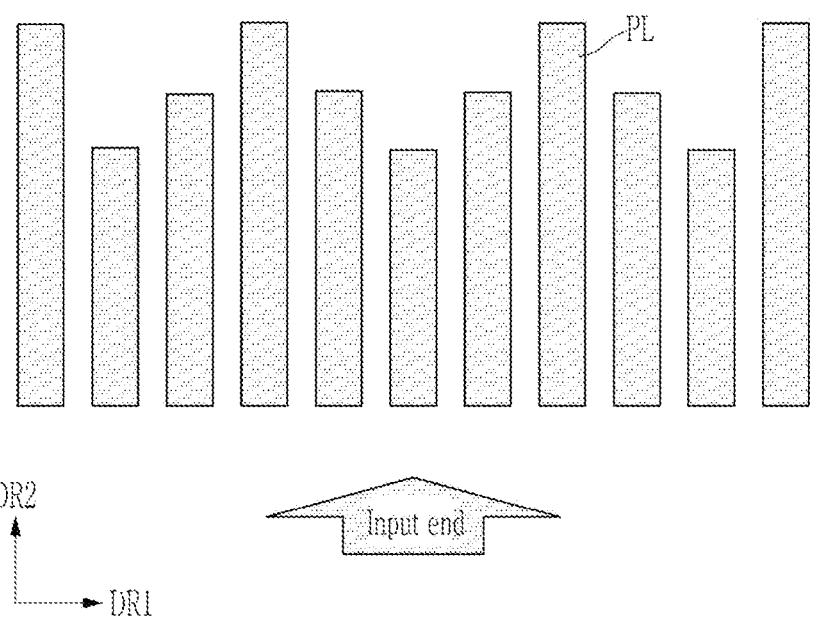
FIG. 8 is a plan view schematically illustrating some components of a display device according to some embodiments.

The display device according to some embodiments shown in FIG. 8 includes the same parts as most of the display device according to some embodiments shown in FIG. 1 to FIG. 6, so the description of the same parts is omitted. In the present embodiments, the length of some regions of the driving voltage line is different from the previous embodiments, which will be described in more detail below.

FIG. 8 is a top plan view schematically showing some constituent elements of a display device according to some embodiments. FIG. 8 shows the planar shape and the arrangement shape of a plurality of driving voltage lines.

As shown in FIG. 8, the display device according to some embodiments includes a plurality of driving voltage lines PL, wherein a plurality of driving voltage lines PL are spaced apart from each other along the first direction DR1. A plurality of driving voltage lines PL extend in parallel to each other along the second direction DR2.

The width of a plurality of driving voltage lines PL may be constant, and the length of a plurality of driving voltage lines PL may be different. The length of a plurality of driving voltage lines PL may be repeatedly increased and decreased along the first direction DR1. The density of the driving voltage line PL may have a form that decreases as the distance from the input end increases.

In the above embodiments, the length of the driving voltage line PL positioned at both ends of the plurality of driving voltage lines PL may be the shortest. In the present embodiments, the length of the driving voltage line PL positioned at both ends of a plurality of driving voltage lines PL may be the longest.

In the position other than the left and right ends of the display device, even if the length of the driving voltage line PL is relatively short, the driving voltage may be received from the driving voltage line PLs positioned on the periphery of both sides. In the left end of the display device, when the length of the driving voltage line PL is short, the driving voltage may be received from the driving voltage line PL positioned around the right side, but the driving voltage line PL is not positioned around the left side. In the right end of the display device, when the length of the driving voltage line PL is short, the driving voltage may be received from the driving voltage line PL positioned around the left side, but the driving voltage line PL is not positioned around the right side. That is, it may be difficult to relatively and smoothly receive the driving voltage from both left and right ends of the display device. Therefore, it is necessary to lower the resistance of the driving voltage line PL at both left and right ends of the display device, and the driving voltage line PL may be formed to extend from the input end to the opposite end. FIG. 8 shows that the lengths of one driving voltage line PL positioned at the left end of the display device and one driving voltage line PL positioned at the right end of the display device are extended relatively long, but is not limited thereto. Two or more driving voltage lines PL positioned on the left end of the display device and two or more driving voltage lines PL positioned on the right end of the display device may be formed to extend from the input end to the opposite end.

Next, the display device according to some embodiments will be described with reference to FIG. 9 as follows.

Figure 9:
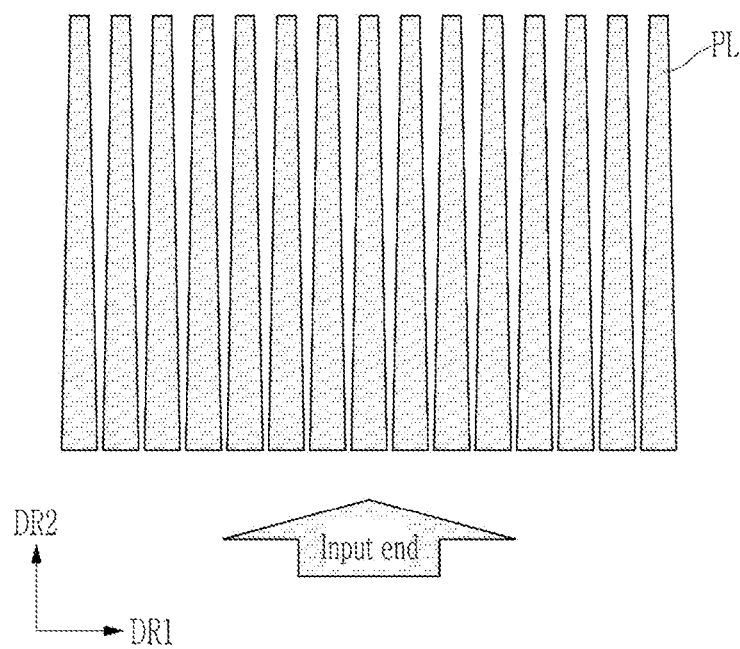
FIG. 9 is a top plan view schematically showing some constituent elements of a display device according to some embodiments.

The display device according to some embodiments shown in FIG. 9 includes the same parts as most of the display device according to some embodiments shown in FIG. 1 to FIG. 6, so the description of the same parts is omitted. The present embodiments are different from the previous embodiments in that the width of the driving voltage line is not constant, and will be described in more detail below.

FIG. 9 is a top plan view schematically showing some constituent elements of a display device according to some embodiments. FIG. 9 shows the planar shape and the arrangement shape of a plurality of driving voltage lines.

As shown in FIG. 9, the display device according to some embodiments includes a plurality of driving voltage lines PL, wherein a plurality of driving voltage lines PL are spaced apart from each other along the first direction DR1. A plurality of driving voltage lines PL extend in parallel to each other along the second direction DR2.

In the preceding embodiments, the width of the driving voltage line PL may be constant, and in the present embodiments, the width of the driving voltage line PL may not be constant. The width of the driving voltage line PL may gradually decrease as it gets farther from the input end. The width of the driving voltage line PL may be greatest at a point close to the input end and smallest at the opposite end of the input end. Accordingly, the density of the driving voltage lines PL may be gradually lowered as it moves away from the input end to which the driving voltage is applied.

In this way, the density of the driving voltage lines PL at the point close to the input end is the highest, and the density of the driving voltage lines PL gradually decreases as the distance from the input end increases, so that the display device may obtain the uniform luminance as a whole.

FIG. 9 shows only the driving voltage line PL, but in fact, some constituent elements of the pixel circuit unit PC may be positioned on the same layer as the driving voltage line PL. Hereinafter, some driving voltage lines PLs, and the pixel circuit unit PC and the light-emitting element ED positioned between them, are described with reference to FIG. 10 and FIG. 11.

Figure 10:
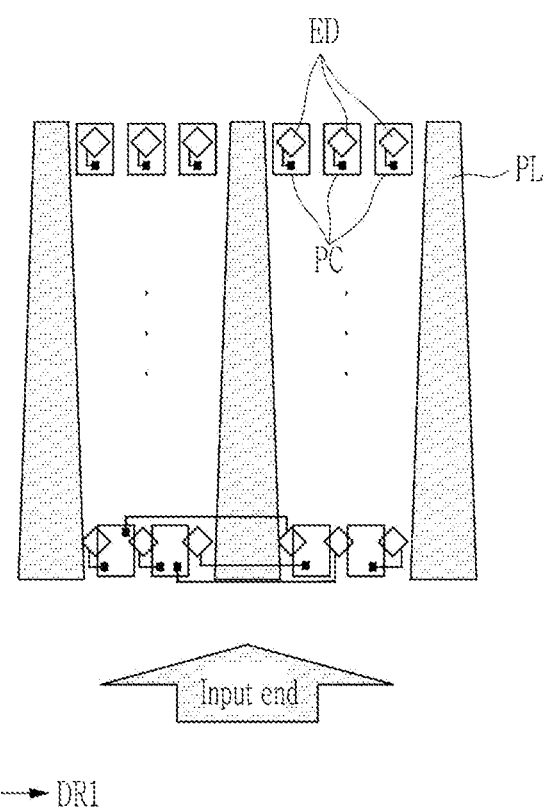
FIG. 10 is a top plan view schematically showing some constituent elements of a display device according to some embodiments.
Figure 11:
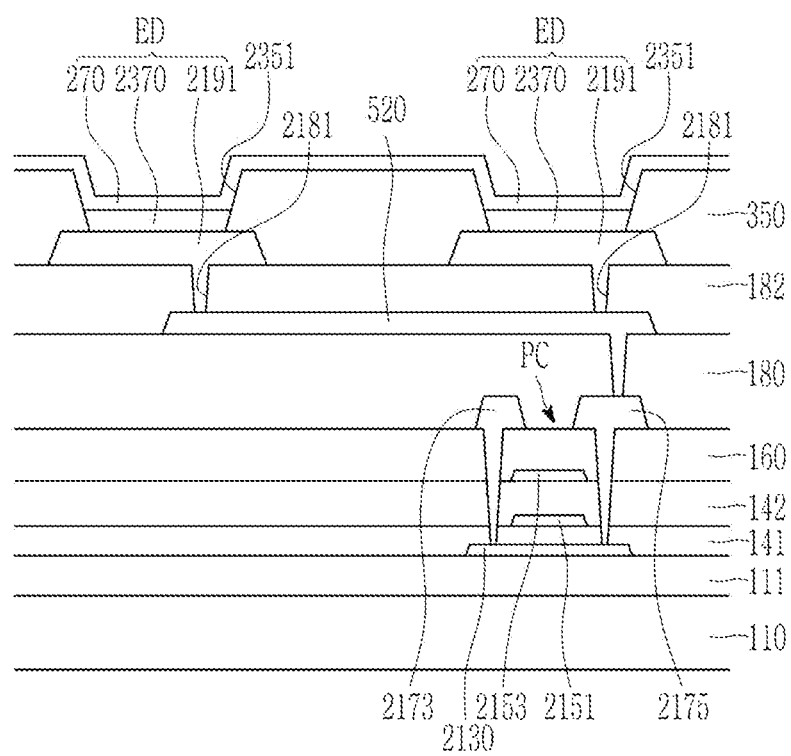
FIG. 11 is a cross-sectional view showing one pixel of a display device according to some embodiments.

FIG. 10 is a top plan view schematically showing some constituent elements of a display device according to some embodiments, and FIG. 11 is a cross-sectional view showing one pixel of a display device according to some embodiments.

As shown in FIG. 10, the pixel circuit unit PC and the light-emitting element ED may be positioned between the driving voltage lines PL of the display device according to some embodiments. The light-emitting element ED is connected to the pixel circuit unit PC, and receives a signal (e.g., a set or predetermined signal) from the pixel circuit unit PC to emit light. The light-emitting element ED may be arranged in various forms, for example, may be arranged in a matrix form along a row direction and a column direction. Between two driving voltage lines PL, the light-emitting elements ED may be arranged along three rows. However, such an arrangement form of the light-emitting element ED is only one example and may be variously changed.

The light-emitting element ED is not positioned on the same layer as the driving voltage line PL, and at least a portion of the light-emitting element ED may overlap the driving voltage line PL. At least some layers of the pixel circuit unit PC may be positioned on the same layer as the driving voltage line PL, and the constituent elements of the pixel circuit unit PC positioned on the same layer as the driving voltage line PL should be designed to be spaced apart at an interval (e.g., a set or predetermined interval) from the driving voltage line PL to prevent or reduce instances of a short circuit. Because the width of the driving voltage line PL at a point far from the input end is relatively small, the space between the driving voltage lines PL may be relatively large, and the pixel circuit unit PC may be formed along three columns. In this case, one light-emitting element ED may be connected to one pixel circuit unit PC. Because the width of the driving voltage line PL at the point adjacent to the input end is relatively large, the space between the driving voltage lines PL may be relatively small, the pixel circuit unit PC cannot be formed along three columns, and the pixel circuit unit PC may be formed along two columns. The distance between two driving voltage lines PL adjacent to each other at the point closest to the input end may be shorter than the distance between two driving voltage lines PL adjacent to each other at the point farthest from the input end. The number of the light-emitting elements ED positioned between two driving voltage lines PL adjacent to each other at the point closest to the input end may be equal to the number of the light-emitting elements ED positioned between two driving voltage lines PL adjacent to each other at the point farthest from the input end. The number of the pixel circuit units PC positioned between two driving voltage lines PL adjacent to each other at the point closest to the input end may be smaller than the number of the pixel circuit units PC positioned between two driving voltage lines PL adjacent to each other at the point farthest from the input end. In this case, one light-emitting element ED may be connected to some pixel circuit units PC, and two or more light-emitting element EDs may be connected to some other pixel circuit units PC. The structure in which one pixel circuit unit PC is connected to one light-emitting element ED may have the structure of FIG. 2 above-described. Hereinafter, the structure in which one pixel circuit unit PC is connected to two light-emitting elements ED is described with reference to FIG. 11.

As shown in FIG. 11, a display device according to some embodiments includes a pixel circuit unit PC positioned on a substrate 110, and a plurality of light-emitting element ED connected to the pixel circuit unit PC.

The pixel circuit unit PC may include a semiconductor 2130, a gate electrode 2151, a source electrode 2173, and a drain electrode 2175. A first storage electrode overlapping the gate electrode 2151 may be positioned on the second gate insulating layer 142. A connection electrode 520 may be positioned on the first passivation layer 180, and the connection electrode 520 may be connected to the drain electrode 2175. The connection electrode 520 may be connected to two light-emitting elements ED.

Each of two light-emitting elements ED may include a pixel electrode 2191, an emission layer 2370, and a common electrode 270. A second passivation layer 182 may be positioned between the connection electrode 520 and the pixel electrode 2191. The connection electrode 520 may be connected to the pixel electrode 2191 through an opening formed in the second passivation layer 182. The connection electrode 520 may be connected to two pixel electrodes 2191.

In the display device according to some embodiments, when the space for forming the pixel circuit unit PC is insufficient in the portion where the width of the driving voltage line PL is relatively wide, by connecting a plurality of light-emitting element ED to one pixel circuit unit PC, the resolution of the display device may be maintained.

Next, the display device according to some embodiments is described with reference to FIG. 12 as follows.

Figure 12:
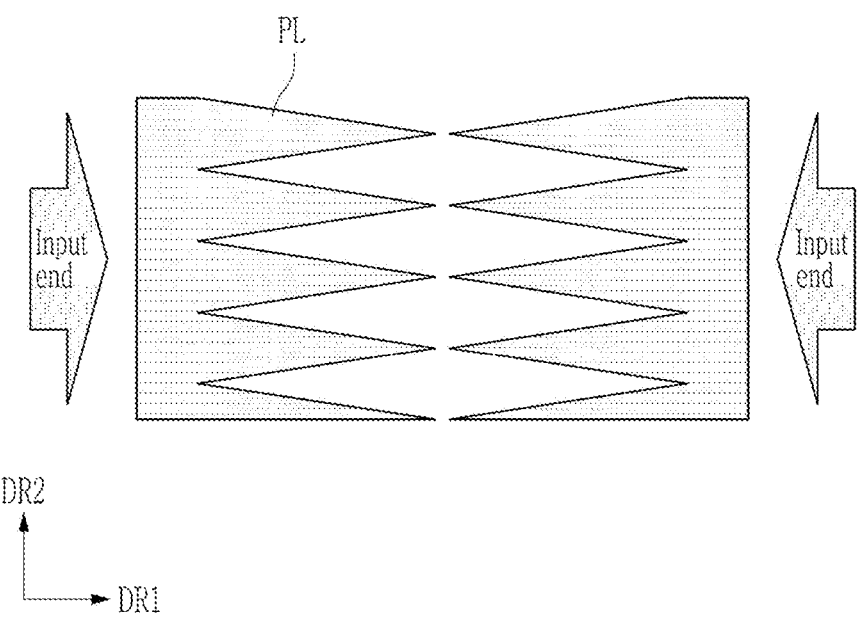
FIG. 12 is a top plan view schematically showing some constituent elements of a display device according to some embodiments.

The display device according to some embodiments shown in FIG. 12 includes the same parts as most of the display device according to some embodiments shown in FIG. 1 to FIG. 6, so the description of the same parts is omitted. The present embodiments are different from the previous embodiments in that the input ends of the driving voltage are positioned at both left and right ends of the display device, which will be described below.

FIG. 12 is a top plan view schematically showing some constituent elements of a display device according to some embodiments. FIG. 12 shows the density of the driving voltage line.

As shown in FIG. 12, a driving voltage may be applied from both left and right sides of the display device. That is, the input end may be positioned at the left end and the right end of the display device. The density PLd of the driving voltage line may have a form that decreases as it moves away from the input end to which the driving voltage is applied.

In the previous embodiments, because the input end is positioned on only one side of the display device, the density PLd of the driving voltage line may have a form that decreases from one side to the other side of the display device. In the present embodiments, because the input ends are positioned on both sides of the display device, the density PLd of the driving voltage line may have a form that decreases from both sides of the display device toward the center.

As such, the density of the driving voltage line PL at the point close to the input end of both sides is the highest, and the density of the driving voltage line PL decreases as the distance from the input end increases, so that the display device may express the uniform luminance as a whole.

Next, the display device according to some embodiments will be described in more detail with reference to FIG. 13 and FIG. 14 as follows.

Figure 13:
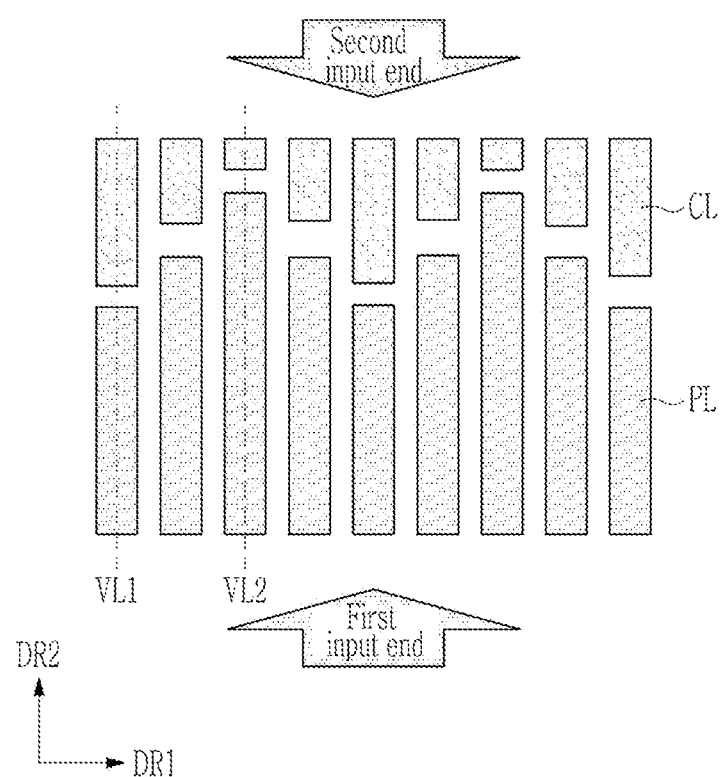
FIG. 13 and FIG. 14 are top plan views schematically showing some constituent elements of a display device according to some embodiments.
Figure 14:
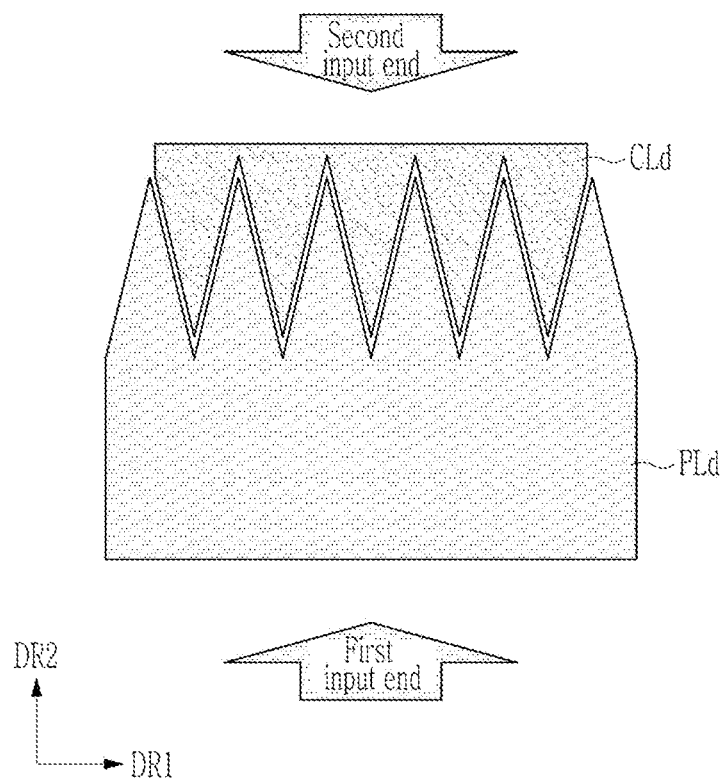

The display device according to some embodiments as shown in FIG. 13 and FIG. 14 includes the same parts as most of the display device according to some embodiments as shown in FIG. 1 to FIG. 6, so the description of the same parts is omitted. The present embodiments are different from the previous embodiments in that the length of the common voltage line is different depending on the position, and will be described in more detail below.

FIG. 13 and FIG. 14 are top plan views schematically showing some constituent elements of a display device according to some embodiments. FIG. 13 shows a planar shape and an arrangement shape of a plurality of driving voltage lines and a plurality of common voltage lines, and FIG. 14 shows the density of the driving voltage line and the common voltage line.

As shown in FIG. 13, the display device according to some embodiments includes a plurality of driving voltage lines PL, wherein a plurality of driving voltage lines PL are spaced apart from each other along a first direction DR1. A plurality of driving voltage lines PL extend parallel to each other along the second direction DR2. The width of a plurality of driving voltage lines PL may be constant, and the length of a plurality of driving voltage lines PL may be different. The length of a plurality of driving voltage lines PL may be repeatedly increased and decreased along the first direction DR1. A plurality of driving voltage lines PL may receive the driving voltage from a first input end positioned in the lower side of the display device.

The display device according to some embodiments includes a plurality of common voltage lines CL, and a plurality of common voltage lines CL may be spaced apart from each other in a first direction DR1. A plurality of common voltage lines CL extend in parallel to each other along the second direction DR2. The width of a plurality of common voltage lines CL may be constant, and a plurality of common voltage lines CL may have different lengths. The length of a plurality of common voltage lines CL may be repeatedly increased and decreased along the first direction DR1. A plurality of common voltage lines CL may receive a common voltage from a second input end positioned in the upper side of the display device.

In this case, each driving voltage line PL and each common voltage line CL may be positioned on an imaginary line extending along the second direction DR2. The length of the common voltage line CL positioned on the same imaginary line VL1 as the driving voltage line PL having a relatively long length may be formed to be relatively short. The length of the common voltage line CL positioned on the same imaginary line VL2 as the driving voltage line PL having a relatively short length may be formed to be relatively long. Accordingly, the sum of the length of the driving voltage line PL and the length of the common voltage line CL positioned on each imaginary line may be the same.

As shown in FIG. 14, the density PLd of the driving voltage line may have a form that decreases as the distance from the first input end to which the driving voltage is applied increases. The density CLd of the common voltage line may have a form that decreases as the distance from the second input end to which the common voltage is applied increases. Where the density PLd of the driving voltage lines is relatively high, the density CLd of the common voltage lines may be relatively low. Where the density PLd of the driving voltage lines is relatively low, the density CLd of the common voltage lines may be relatively high.

As such, the density PLd of the driving voltage lines at a point close to the first input end is the highest, and the density PLd of the driving voltage lines decreases as it goes away from the first input end, so that the display device may display the uniform luminance as a whole. In addition, the empty space may be utilized by increasing the density CLd of the common voltage lines in a portion where the density of the driving voltage lines is relatively low. In this case, the driving voltage line PL and the common voltage line CL may be positioned on the same layer.

Next, the display device according to some embodiments will be described in more detail with reference to FIG. 15 as follows.

Figure 15:
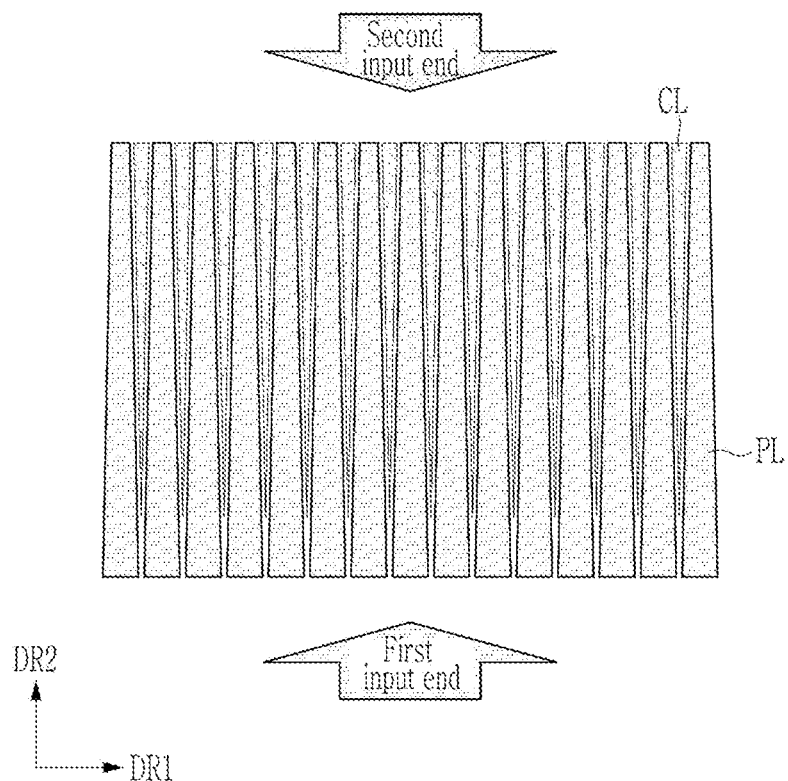
FIG. 15 is a top plan view schematically showing some constituent elements of a display device according to some embodiments.

The display device as shown in FIG. 15 includes the same parts as most of the display device according to some embodiments shown in FIG. 9, so the description of the same parts may be omitted. The present embodiments are different from the previous embodiments in that the common voltage line is located in a space where the driving voltage line is not located, and the width of the common voltage line is not constant, which will be described below.

FIG. 15 is a top plan view schematically showing some constituent elements of a display device according to some embodiments. FIG. 15 represents a flat shape and an arrangement shape of a plurality of driving voltage lines and a plurality of common voltage lines.

As shown in FIG. 15, a display device according to some embodiments includes a plurality of driving voltage lines PL, and a plurality of driving voltage lines PL are spaced apart from each other along the first direction DR1. A plurality of driving voltage lines PL extend parallel to each other along the second direction DR2. A plurality of driving voltage lines PL may receive a driving voltage from a first input end positioned below the display device. The width of the driving voltage line PL may gradually decrease as it goes away from the first input end. The width of the driving voltage line PL may be greatest at a point close to the first input end, and may be smallest at an end opposite to the first input end. Accordingly, the density of the driving voltage line PL may be gradually lowered as it moves away from the first input end to which the driving voltage is applied.

The display device according to some embodiments includes a plurality of common voltage lines CL, and a plurality of common voltage lines CL are spaced apart from each other in a first direction DR1. A plurality of common voltage lines CL extend parallel to each other along the second direction DR2. A plurality of common voltage lines CL may receive a common voltage from a second input end positioned at the upper side of the display device. The width of the common voltage line CL may decrease gradually as it goes away from the second input end. The width of the common voltage line CL may be greatest at the point close to the second input end, and smallest at the opposite end of the second input end. Accordingly, the density of the common voltage line CL may be gradually lowered as it moves away from the second input end to which the common voltage is applied.

As such, the density PLd of the driving voltage line at the point close to the first input end is the highest, and the density PLd of the driving voltage line decreases as it goes away from the first input end, so that the display device may obtain the uniform luminance as a whole. In addition, an empty space may be utilized by increasing the density CLd of the common voltage lines in a portion where the density of the driving voltage lines is relatively low. In this case, the driving voltage line PL and the common voltage line CL may be positioned on the same layer.

As such, when the widths of the driving voltage line PL and the common voltage line CL are different according to positions, an area occupied by the driving voltage line PL in each pixel may be different. Also, an area occupied by the common voltage line CL in each pixel may be different. In this case, the sum of the area occupied by the driving voltage line PL and the area occupied by the common voltage line CL in each pixel may be the same, which will be described below with reference to FIG. 16 and FIG. 17.

Figure 16:
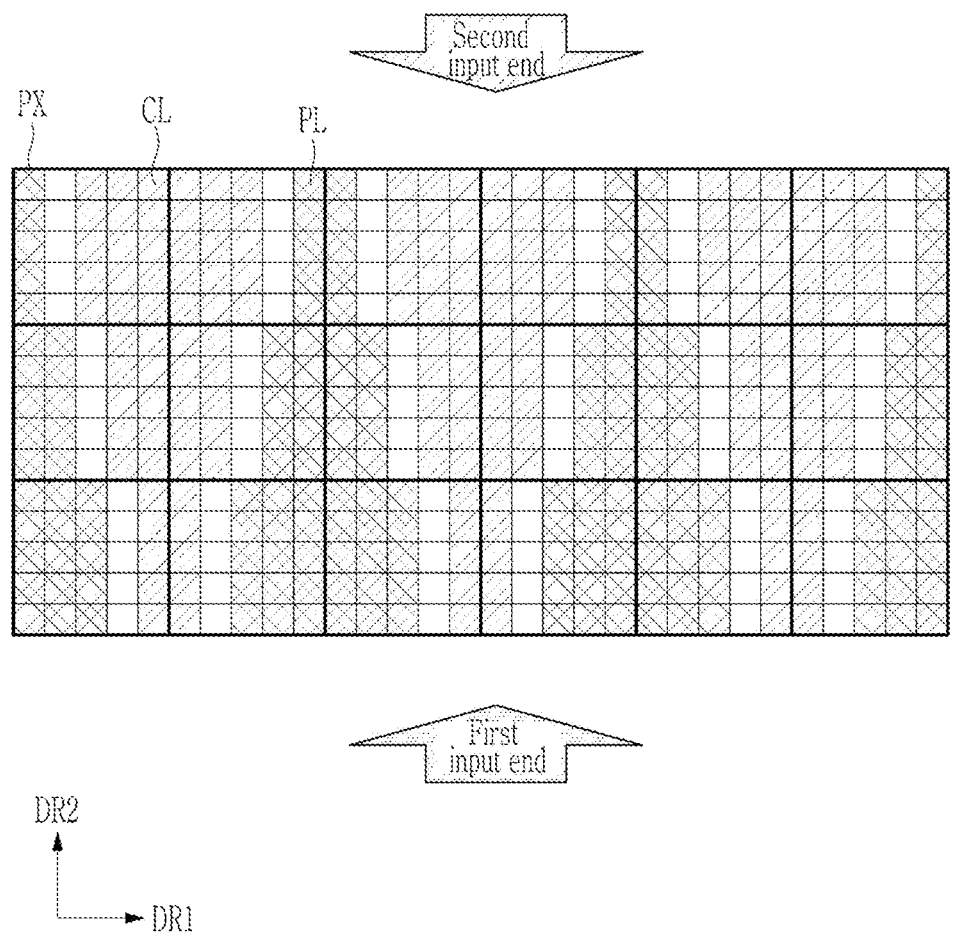
FIG. 16 and FIG. 17 are top plan views schematically showing some constituent elements of a display device according to some embodiments.
Figure 17:
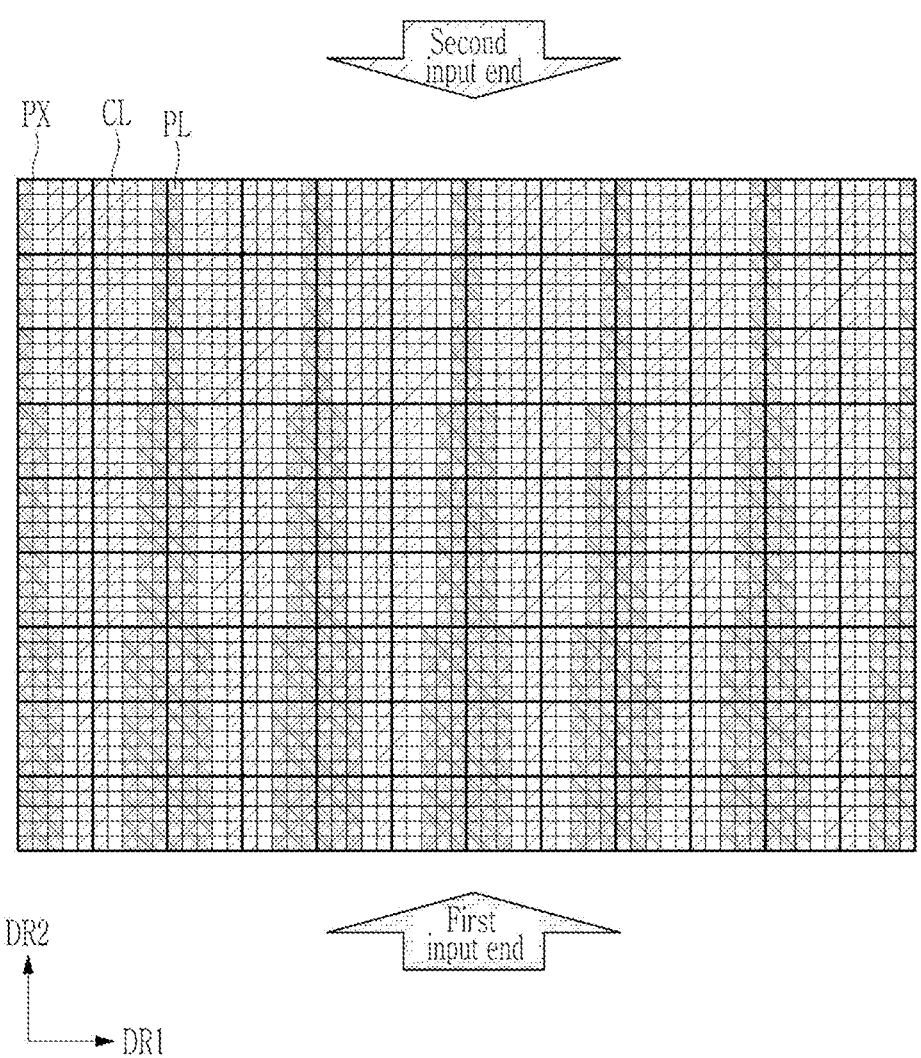

FIG. 16 and FIG. 17 are top plan views schematically showing some constituent elements of a display device according to some embodiments. FIG. 16 and FIG. 17 divide the display area of the display device according to some embodiments into a plurality of pixels PX, and represent each pixel PX in a lattice form to indicate an area occupied by a driving voltage line and a common voltage line in each pixel. Each pixel PX includes a total of 25 squares: 5 horizontally and 5 vertically.

As shown in FIG. 16, the display device according to some embodiments includes a plurality of driving voltage lines PL and a plurality of common voltage lines CL. The width of the driving voltage line PL may gradually decrease as it gets farther from the first input end. For example, the width of the driving voltage line PL in the row closest to the first input end may correspond to about six squares, and the width of the driving voltage line PL in the row furthest from the first input end may correspond to about two squares. In this case, the row means a row composed of unit cells for indicating an area.

The width of the common voltage line CL may decrease gradually as it goes away from the second input end. For example, the width of the common voltage line CL at the point closest to the second input end may correspond to about six squares, and the width of the common voltage line CL at the point farthest from the second input end may correspond to about two squares.

Looking at the pixels PX positioned in the first pixel row, the area occupied by the driving voltage line PL in one pixel PX may be about 5 squares, and the area occupied by the common voltage line CL may be about 15 squares. Accordingly, the area occupied by the driving voltage line PL and the common voltage line CL in each pixel PX positioned in the first pixel row may be about 20 squares. Although only the driving voltage line PL and the common voltage line CL are shown in FIG. 16, in reality, other constituent elements constituting the pixel circuit unit may be positioned on the same layer as the driving voltage line PL and the common voltage line CL. In each pixel PX positioned in the first pixel row, the area on a plane of the region in which the driving voltage line PL and the common voltage line CL are not positioned may be about 5 squares.

Looking at the pixel PXs positioned in the second pixel row, the area occupied by the driving voltage line PL in one pixel PX may be about 10 squares, and the area occupied by the common voltage line CL may be about 10 squares. Accordingly, the area occupied by the driving voltage line PL and the common voltage line CL in each pixel PX positioned in the first pixel row may be about 20 squares. In each pixel PX positioned in the first pixel row, the area on a plane of the region in which the driving voltage line PL and the common voltage line CL are not positioned may be about 5 squares.

Looking at the pixel PXs positioned in the third pixel row, the area occupied by the driving voltage line PL in one pixel PX may be about 15 squares, and the area occupied by the common voltage line CL may be about 5 squares. Accordingly, the area occupied by the driving voltage line PL and the common voltage line CL in each pixel PX positioned in the first pixel row may be about 20 squares. In each pixel PX positioned in the first pixel row, the area on a plane of the region where the driving voltage line PL and the common voltage line CL are not positioned may be about 5 squares.

As such, the sum of the area occupied by the driving voltage line PL and the area occupied by the common voltage line CL in each pixel PX may be constant. Also, in each pixel PX, a planar area of a region in which the driving voltage line PL and the common voltage line CL are not positioned may be constant.

FIG. 16 shows the pixels PX positioned in three pixel rows, and shows a case where the width of the driving voltage line PL and the width of the common voltage line CL are different for each pixel row. FIG. 17 shows the pixels PX positioned in the nine pixel rows, and shows the case in which the width of the driving voltage line PL and the width of the common voltage line CL are different in a cycle of three pixel rows.

Looking at the pixels PX positioned in the first to third pixel rows, the area occupied by the driving voltage line PL in one pixel PX may be about 5 squares, the area occupied by the common voltage line CL may be about 15 squares, and the remaining constituent elements may occupy about 5 squares.

Looking at the pixels PX positioned in the fourth to sixth pixel rows, the area occupied by the driving voltage line PL in one pixel PX may be about 10 squares, the area occupied by the common voltage line CL may be about 10 squares, and the remaining constituent elements may occupy about 5 squares.

Looking at the pixels PX positioned in the seventh to ninth pixel rows, the area occupied by the driving voltage line PL in one pixel PX may be about 15 squares, the area occupied by the common voltage line CL may be about 5 squares, and the remaining constituent elements may occupy about 5 squares.

As such, the sum of the area occupied by the driving voltage line PL and the area occupied by the common voltage line CL in each pixel PX may be constant. Also, in each pixel PX, a planar area of a region in which the driving voltage line PL and the common voltage line CL are not positioned may be constant.

While aspects of some embodiments according to the present disclosure have been described in connection with what is presently considered to be practical embodiments, it is to be understood that the invention is not limited to the disclosed embodiments. On the contrary, it is intended to cover various modifications and equivalent arrangements included within the spirit and scope of the appended claims and their equivalents.

DESCRIPTION OF SOME OF THE REFERENCE SYMBOLS

PL: driving voltage line
PLd: density of driving voltage line
CL: common voltage line
CLd: density of common voltage line
PC: pixel circuit unit
ED: light-emitting element
40: pad unit
60: driving voltage supplier
70: common voltage supplier

What is claimed is:
1. A display device comprising:
a substrate;
a plurality of light-emitting elements on the substrate;
a plurality of pixel circuit units on the substrate and connected to the plurality of light-emitting elements;
a plurality of voltage lines connected to the pixel circuit units and extending parallel to each other on the substrate and configured to provide a driving voltage to the pixel circuit units to drive the light-emitting elements; and
a voltage supplier connected to one side end of the plurality of voltage lines and configured to transmit a voltage to the plurality of voltage lines,
wherein a density of the plurality of voltage lines in a first half of the display device is constant, and the density of the plurality of voltage lines in a second half of the display device decreases farther away from the voltage supplier.
2. The display device of claim 1, wherein
the plurality of voltage lines include a plurality of driving voltage lines configured to transmit the driving voltage,
the voltage supplier includes a driving voltage supplier connected to the plurality of driving voltage lines,
the plurality of driving voltage lines are connected to the driving voltage supplier at one side end of the substrate, and
the density of the plurality of driving voltage lines decreases away from a first input end connected to the driving voltage supplier.

3. The display device of claim 2, wherein
the plurality of driving voltage lines are spaced apart from each other along a first direction and extend parallel to each other along a second direction intersecting the first direction, and
the plurality of driving voltage lines have different lengths.

4. The display device of claim 3, wherein a length of the plurality of driving voltage lines repeatedly increases and decreases along the first direction.

5. The display device of claim 4, wherein the density of the plurality of driving voltage lines is constant in a portion adjacent to the first input end and then gradually decreases.

6. The display device of claim 3, wherein among the plurality of driving voltage lines, a length of the driving voltage lines positioned at both ends of the substrate is longest.

7. The display device of claim 2, wherein
the plurality of driving voltage lines are spaced apart from each other along a first direction and extend parallel to each other along a second direction intersecting the first direction, and
a width of the plurality of driving voltage lines gradually decreases away from the first input end.

8. The display device of claim 7, further comprising:
a first group of the plurality of light-emitting elements between two adjacent driving voltage lines,
wherein a number of the light-emitting elements in the first group of the plurality of light-emitting elements between two adjacent driving voltage lines at a point closest to the first input end is equal to a number of the light-emitting elements in a second group of the plurality of light-emitting elements between two adjacent driving voltage lines at a point farthest from the first input end, and
a number of the pixel circuit units between two adjacent driving voltage lines at the point closest to the first input end is smaller than a number of the pixel circuit units between two adjacent driving voltage lines at the point farthest from the first input end.

9. The display device of claim 8, wherein a distance between two adjacent driving voltage lines at a point closest to the first input end is closer than a distance between two adjacent driving voltage lines at the point farthest from the first input end.

10. The display device of claim 8, wherein some of the plurality of pixel circuit units are connected to one light-emitting element, and other pixel circuit units are connected to the plurality of light-emitting elements.

11. The display device of claim 10, wherein a pixel circuit unit between two adjacent driving voltage lines at the point farthest from the first input end is connected to the plurality of light-emitting elements.

12. The display device of claim 2, wherein
the first input end is respectively positioned at both ends of the display device, and
a density of the plurality of driving voltage lines decreases from both sides of the display device toward a center.

13. The display device of claim 2, wherein
the plurality of voltage lines further includes a plurality of common voltage lines configured to transmit a common voltage,
the voltage supplier further includes a common voltage supplier connected to the plurality of common voltage lines,
the plurality of common voltage lines are connected to the common voltage supplier at the other side end of the substrate, and
a density of the plurality of common voltage lines decreases with an increased distance from a second input end connected to the common voltage supplier.

14. The display device of claim 13, wherein
the plurality of common voltage lines are spaced apart from each other along a first direction and extend in parallel with each other along a second direction intersecting the first direction, and
the plurality of common voltage lines have different lengths.

15. The display device of claim 14, wherein
a length of the plurality of common voltage lines repeatedly increases and decreases along the first direction.

16. The display device of claim 15, wherein
each driving voltage line and each common voltage line are on an imaginary line extending along the second direction, and
a sum of the length of a driving voltage line and the length of a common voltage line on each imaginary line is equal.

17. The display device of claim 13, wherein
the plurality of driving voltage lines are spaced apart from each other along a first direction and extend parallel to each other along a second direction intersecting the first direction,
a width of the plurality of driving voltage lines gradually decreases as it moves away from the first input end,
the plurality of common voltage lines are spaced apart from each other along the first direction and extend parallel to each other along the second direction, and
a width of the plurality of common voltage lines gradually decreases as it moves away from the second input end.

18. The display device of claim 17, wherein
the display device includes a plurality of pixels, and
a sum of an area occupied by the driving voltage line and an area occupied by the common voltage line is equal within each pixel.

19. A display device comprising:
a substrate;
a plurality of driving voltage lines spaced apart from each other along a first direction on the substrate and extending parallel to each other along a second direction intersecting the first direction;
a driving voltage applying unit connected to one side end of the plurality of driving voltage lines,
wherein a length from one side end of the plurality of driving voltage lines to the other side end repeats a pattern that gradually increases along the first direction and then gradually decreases; and
a plurality of common voltage lines spaced apart from each other along a first direction on the substrate and extending parallel to each other along a second direction intersecting the first direction, the common voltage lines aligned with corresponding driving voltage lines along the first direction, wherein
a sum of the length of the driving voltage line and a length of the common voltage line positioned on each imaginary line is equal.

20. The display device of claim 19, further comprising:
a common voltage applying unit connected to one side end of the plurality of common voltage lines, and
wherein a length from a first side end to a second side end of the plurality of common voltage lines repeats a pattern that gradually increases along the first direction and then gradually decreases, and each driving voltage line and each common voltage line are on an imaginary line extending along the second direction.

* * * * *